United States Patent
Yoon (10) Patent No.: US 8,670,279 B2
(45) Date of Patent: Mar. 11, 2014

(54) NON-VOLATILE MEMORY DEVICE AND PROGRAM METHOD THEREOF

(75) Inventor: Mi-Sun Yoon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 273 days.

(21) Appl. No.: 13/205,936

(22) Filed: Aug. 9, 2011

(65) Prior Publication Data
US 2012/0269000 A1 Oct. 25, 2012

(30) Foreign Application Priority Data
Apr. 21, 2011 (KR) ........................ 10-2011-0037514

(51) Int. Cl.
*G11C 11/34* (2006.01)
(52) U.S. Cl.
USPC ............. 365/185.22; 365/185.14; 365/185.28
(58) Field of Classification Search
USPC .................................................... 365/185.22
See application file for complete search history.

(56) References Cited

U.S. PATENT DOCUMENTS

| 7,764,542 B2* | 7/2010 | Edahiro et al. ........... 365/185.03 |
| 2009/0103365 A1* | 4/2009 | Roohparvar et al. .... 365/185.17 |

FOREIGN PATENT DOCUMENTS

KR  100854903  8/2008

OTHER PUBLICATIONS

Office Action issued by the Korean Intellectual Property Office on Sep. 28, 2012.

* cited by examiner

*Primary Examiner* — Anthan Tran
(74) *Attorney, Agent, or Firm* — IP & T Group LLP (57) ABSTRACT

A method for programming a non-volatile memory device including a plurality of memory cells includes verifying whether the memory cells are programmed or not by applying a program verification bias voltage, which is calculated and stored during an initialization operation preformed before the programming of the memory cells, after a program voltage is applied to word lines of the memory cells.

13 Claims, 7 Drawing Sheets

NON-VOLATILE MEMORY DEVICE AND PROGRAM METHOD THEREOF

CROSS-REFERENCE TO RELATED APPLICATIONS

The present application claims priority of Korean Patent Application No. 10-2011-0037514, filed on Apr. 21, 2011, which is incorporated herein by reference in its entirety.

BACKGROUND

1. Field

Exemplary embodiments of the present invention relate to a non-volatile memory device and a program method thereof, and more particularly, to a non-volatile memory device that may reduce a program unit time and a program method thereof.

2. Description of the Related Art

Memory devices are divided into volatile memory devices and non-volatile memory devices according to whether data are retained when a power supply is cut off. Volatile memory devices are memory devices which lose the data stored therein when a power supply is cut off. Examples of the volatile memory devices include Dynamic Random Access Memory (DRAM) devices and Synchronous DRAM (SDRAM). On the other hand, non-volatile memory devices retain the data stored therein even if a power supply is cut off. Examples of the non-volatile memory devices include a flash memory device.

The non-volatile memory devices may electrically program and erase data and there are increasing demands for non-volatile memory devices which do not have to perform a refresh operation where a data is reprogrammed at a predetermined cycle. Here, a program operation is an operation of writing a data in a memory cell.

A NAND flash memory which forms a string, where a plurality of memory cells (that is, a structure where adjacent cells share a drain or source with another) are coupled in series, has been developed to highly integrate a memory device. A NAND flash memory device is a memory that sequentially reads data, which is different from a NOR flash memory.

As a demand for NAND flash memory devices as data storage media increases, large-volume flash memory devices are useful. To increase the storage capacity in a small chip size, a multi-level cell (MLC) structure where a data of more than 2 bits is stored in one memory cell is used. The MLC technology is effective in increasing the data storage capacity without much change in the fabrication technology. In other words, differently from a single level cell (SLC) structure, the MLC structure has a program cell threshold voltage distribution, where the MLC structure may represent data of two bits, three bits, four bits or more.

For NAND flash memory devices of the SLC or MLC structure, a programming speed and a decrease in the distribution width of cell threshold voltages Vt are significant. Particularly, since it is expected that the MLC technology advance into 8 level technology, the decrease in the distribution width of cell threshold voltages Vt of memory cells is desired. Therefore, a program method using Incremental Step Pulse Program (ISPP) method in which a selected page is programmed several times by gradually increasing the bias voltage applied to a word line on the basis of a predetermined step bias increase unit is developed and implemented.

Figure 7:
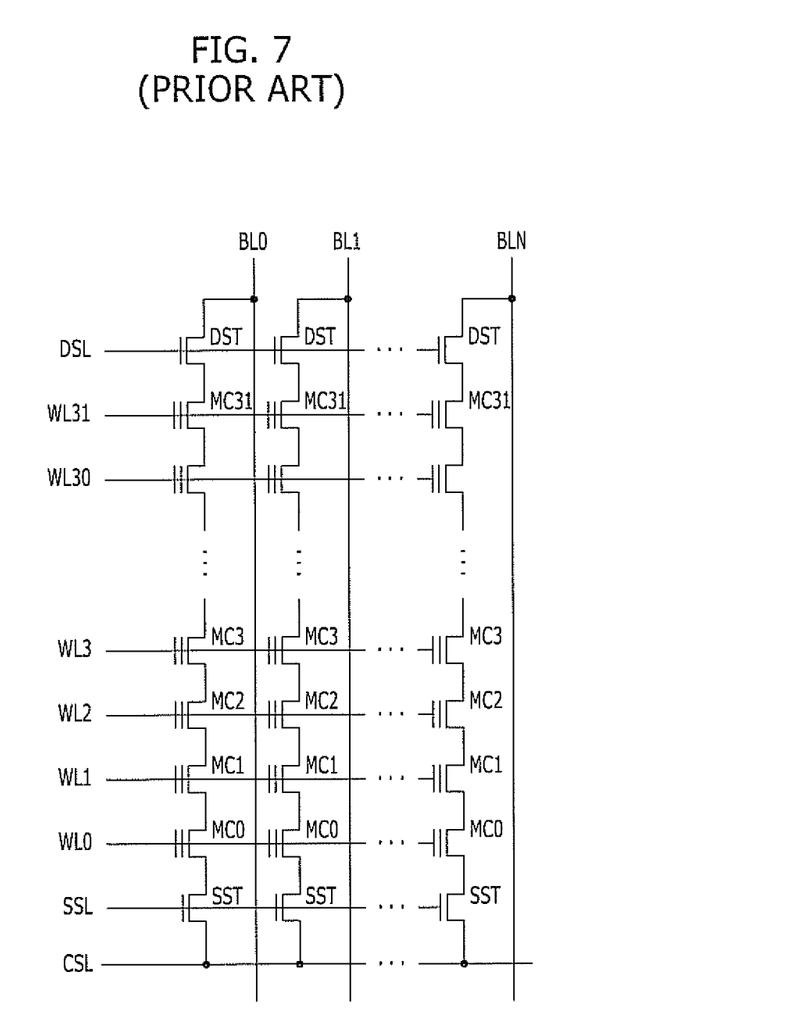
FIG. 7 illustrates a memory cell array of a conventional non-volatile memory device.

Hereafter, with reference to FIG. 7, a structure of a conventional non-volatile memory device is briefly described. FIG. 7 illustrates a memory cell array of the conventional non-volatile memory device.

Referring to FIG. 7, the memory cell array includes a plurality of cell strings coupled with bit lines BL0 to BLN, and each cell string includes a source selection transistor SST, a plurality of memory cell transistors MC0 to MC31, and a drain selection transistor DST.

A gate of the source selection transistor SST is coupled in common with the source selection lines SSL. A gate of the drain selection transistor DST is coupled with a drain selection line DSL. The control gates of the memory cell transistors MC0 to MC31 are coupled with word lines WL0 to WL31. The memory cell transistors MC0 to MC31 are coupled in series between the source selection transistor SST and the drain selection transistor DST.

The number of memory cells included in one cell string may be 32, as illustrated in the drawing, or may be different according to the storage capacity of a memory device. The source selection transistor SST and the drain selection transistor DST are typical MOS transistors, and the memory cell transistors MC0 to MC31 are floating gate transistors.

In the memory device of the above-described structure, the physical characteristics of the memory cell transistors MC0 to MC31 may differ according to the position of the memory cell transistors MC0 to MC31 disposed in a cell string.

To address such a feature, a program verification bias voltage may be adjusted appropriately to the physical characteristics of the memory cell transistors MC0 to MC31 based on the positions of the memory cell transistors MC0 to MC31. To this end, a program verification bias voltage level is to be calculated every time when the program verification bias voltage is to be used.

Here, the program verification bias voltage includes a characteristic voltage according to the characteristics of each memory cell and a default bias voltage, e.g., approximately 5V or lower. The characteristic voltage includes an offset bias voltage for each group, e.g., a voltage of approximately 3V or lower, and an offset bias voltage of an edge word line, e.g., a voltage of approximately 3V or lower. Here, the program unit time is a time ranging from a moment when a program pulse is applied to a moment when a plurality of program verification bias voltages are applied.

Figure 8:
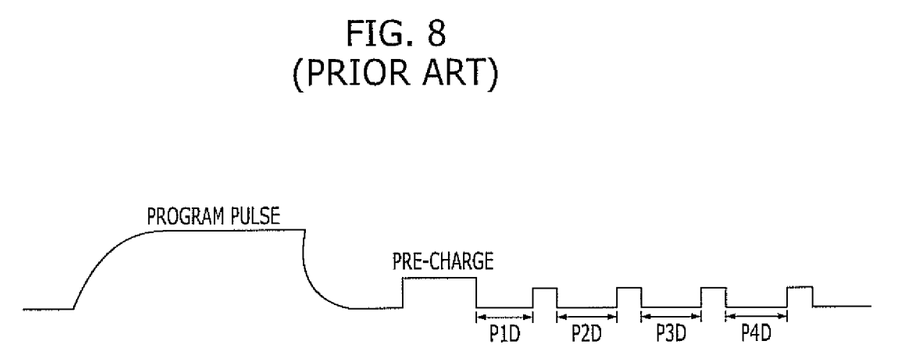
FIG. 8 is a waveform diagram showing application of a program pulse and a program verification bias voltage for a conventional non-volatile memory device.

FIG. 8 is a waveform diagram showing application of a program pulse and a program verification bias voltage for a conventional memory cell array (for example, the memory array shown in FIG. 7). More specifically, as illustrated in FIG. 8, after the program pulse is applied, a calculation operation for generating a first program verification bias voltage PV1 is performed for a first setup duration P1D, and the first program verification bias voltage PV1 generated as a calculation operation result is applied to the word line of a corresponding memory cell. The above calculation operation is performed by summing the default bias voltage, the offset bias voltage for each group, and the offset bias voltage of an edge word line.

Subsequently, a calculation operation for generating a second program verification bias voltage PV2 is performed for a second setup duration P2D, and the second program verification bias voltage PV2 generated as a result of the calculation operation is applied to the word line of a corresponding memory cell.

Subsequently, a calculation operation for generating a third program verification bias voltage PV3 is performed for a third setup duration P3D, and the third program verification bias voltage PV3 generated as a result of the calculation operation is applied to the word line of a corresponding memory cell.

Subsequently, a calculation operation for generating a fourth program verification bias voltage PV4 is performed for a fourth setup duration P4D, and the fourth program verification bias voltage PV4 generated as a result of the calculation operation is applied to the word line of a corresponding memory cell.

Here, if the program verification bias voltage level is calculated whenever the program verification bias voltage is used, the program unit time increases.

Particularly, since the application of the program pulse and the application of the program verification bias voltage according to the program operation are performed iteratively, the resulting increase in the program unit time as described above delays the program operation.

SUMMARY

An embodiment of the present invention is directed to a non-volatile memory device which may reduce a program unit time by calculating and storing a program verification bias voltage in advance before a program voltage is applied and then applying the stored program verification bias voltage to a corresponding word line after the program voltage is applied, and a program method thereof.

Another embodiment of the present invention is directed to a non-volatile memory device that may be used for a high-speed operation by reducing a program unit time, and a program method thereof.

In accordance with an embodiment of the present invention, a method for programming a non-volatile memory device including a plurality of memory cells includes: verifying whether the memory cells are programmed or not by applying a program verification bias voltage, which is calculated and stored during an initialization operation preformed before the programming of the memory cells, after a program voltage is applied to word lines of the memory cells.

In accordance with another embodiment of the present invention, a method for programming a non-volatile memory device including a plurality of memory cells includes: generating and storing a program verification bias voltage corresponding to the memory cells by summing a characteristic voltage of a group of memory cells and a default bias voltage before a program pulse is applied to the memory cells; and verifying whether the memory cells are programmed or not by applying the stored program verification bias voltage to a word line of the memory cells when the program voltage is applied to the memory cells.

In accordance with yet another embodiment of the present invention, a non-volatile memory device includes: a plurality of memory cells; and a program verification bias voltage providing unit configured to calculate and store a program verification bias voltage corresponding to the memory cells during an initialization operation and provide the stored program verification bias voltage after a program voltage is applied to a word line of the memory cells during a program operation.

In accordance with still another embodiment of the present invention, a non-volatile memory device includes: a memory cell block including a plurality of memory cells; a computation unit configured to generate a program verification bias voltage corresponding to the memory cells by summing a default bias voltage and a characteristic voltage of a memory cell before a program pulse is applied to the memory cells; a storage unit configured to store the generated program verification bias voltage; and a program verification bias voltage providing unit configured to provide the program verification bias voltage stored in the storage unit to a word line of the memory cells when a program pulse is applied to the memory cells.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1:
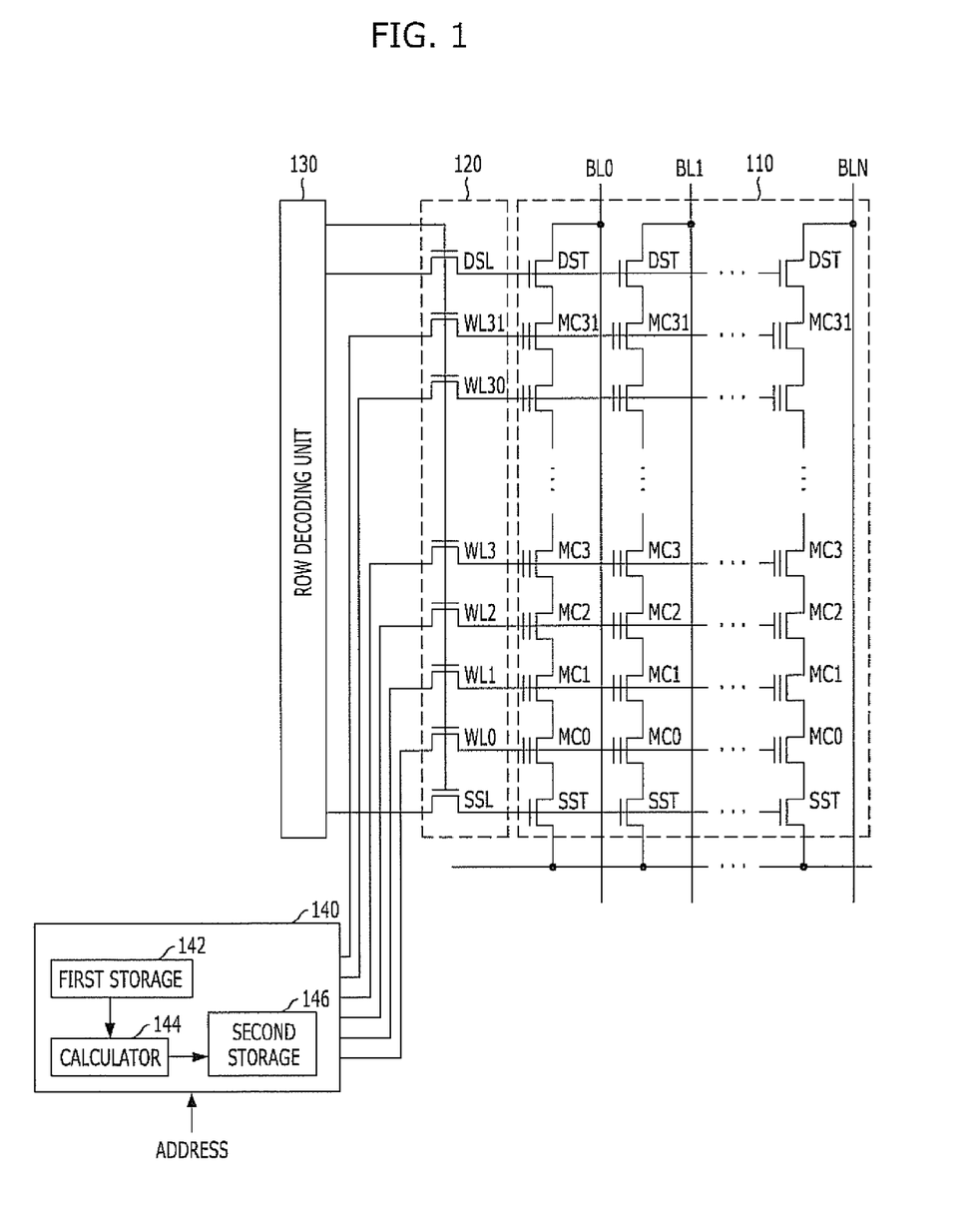
FIG. 1 is a circuit diagram illustrating a structure of a non-volatile memory device in accordance with an embodiment of the present invention.

FIG. 1 is a circuit diagram illustrating a structure of a non-volatile memory device in accordance with an embodiment of the present invention.

The non-volatile memory device of FIG. 1 includes a cell string array unit 110 and a program verification bias voltage providing unit 140.

The cell string array unit 110 includes a plurality of cell strings coupled with bit lines BL0 to BLN, and each cell string includes a source selection transistor SST, a plurality of memory cell transistors MC0 to MC31, and a drain selection transistor DST.

A gate of the source selection transistor SST is coupled in common with source selection lines SSL, and a gate of the drain selection transistor DST is coupled with a drain selection line DSL. Control gates of the memory cell transistors MC0 to MC31 are coupled with word lines WL0 to WL31, and the memory cell transistors MC0 to MC31 are coupled in series between the source selection transistor SST and the drain selection transistor DST.

The number of memory cells included in a cell string may be 32, as illustrated in the drawing, but it may be different, e.g., 16 or 64, according to the storage capacity of the memory device. The source selection transistors SST and the drain selection transistors DST are MOS transistors, and the memory cell transistors MC0 to MC31 may be floating gate transistors.

The program verification bias voltage providing unit 140 includes a first storage 142, a calculator 144, and a second storage 146. The program verification bias voltage supplier 140 calculates and stores a program verification bias voltage corresponding to the memory cell transistors MC0 to MC31 in advance during an initialization operation, and then during a program operation, the program verification bias voltage supplier 140 supplies the stored program verification bias voltage after a program voltage is applied to the word lines of the multiple memory cells.

Here, the initialization operation is an operation for setting up diverse parameters used for the non-volatile memory device before the program pulse according to a program operation is applied.

The first storage 142 stores a characteristic voltage according to the characteristics of each memory cell and a default bias voltage, e.g., a voltage of approximately 5V or lower. The characteristic voltage includes an offset bias voltage for each group of memory cells, e.g., a voltage of approximately 3V or lower, and an offset bias voltage for an edge word line, e.g., a voltage of approximately 3V or lower. The offset bias voltage for each group of memory cells is obtained after grouping memory cells of the same characteristics, and the offset bias voltage for an edge word line is a voltage set up in the memory cells disposed on both ends of each cell string.

The calculator 144 generates a program verification bias voltage by summing the default bias voltage stored in the first storage 142 and the characteristic voltage during the initialization operation. In other words, in this embodiment of the present invention, the calculator 144 sums up all the default bias voltage, the offset bias voltage for each group, and the offset bias voltage for an edge word line.

The second storage 146 stores the program verification bias voltage generated in the calculator 144 during the initialization operation.

When a program voltage is applied to the word lines of the multiple memory cells according to the program operation after the initialization operation, the program verification bias voltage supplier 140 receives an address corresponding to each word line and transfers a program verification bias voltage stored in the second storage 146 which corresponds to the received address to a word line switching unit 120. The word line switching unit 120 applies the program verification bias voltage to a corresponding word line in response to an output signal of a row decoding unit 130.

Figure 4:
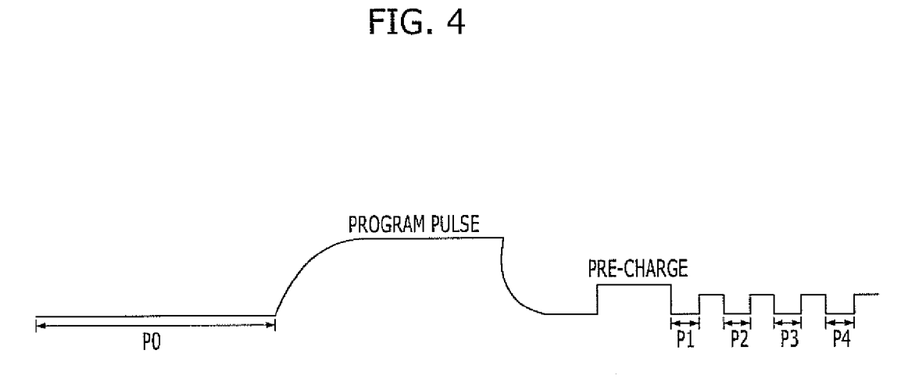
FIG. 4 is a waveform of an operation of a non-volatile memory device in accordance with an embodiment of the present invention.

More specifically, referring to FIG. 4, since the program verification bias voltage which is calculated and stored in advance during the initialization operation PO is applied to a corresponding word line after the program voltage is applied, it does not have to perform the operation for generating the program verification bias voltage after the program voltage is applied. Therefore, the program unit time may be reduced.

Figure 2:
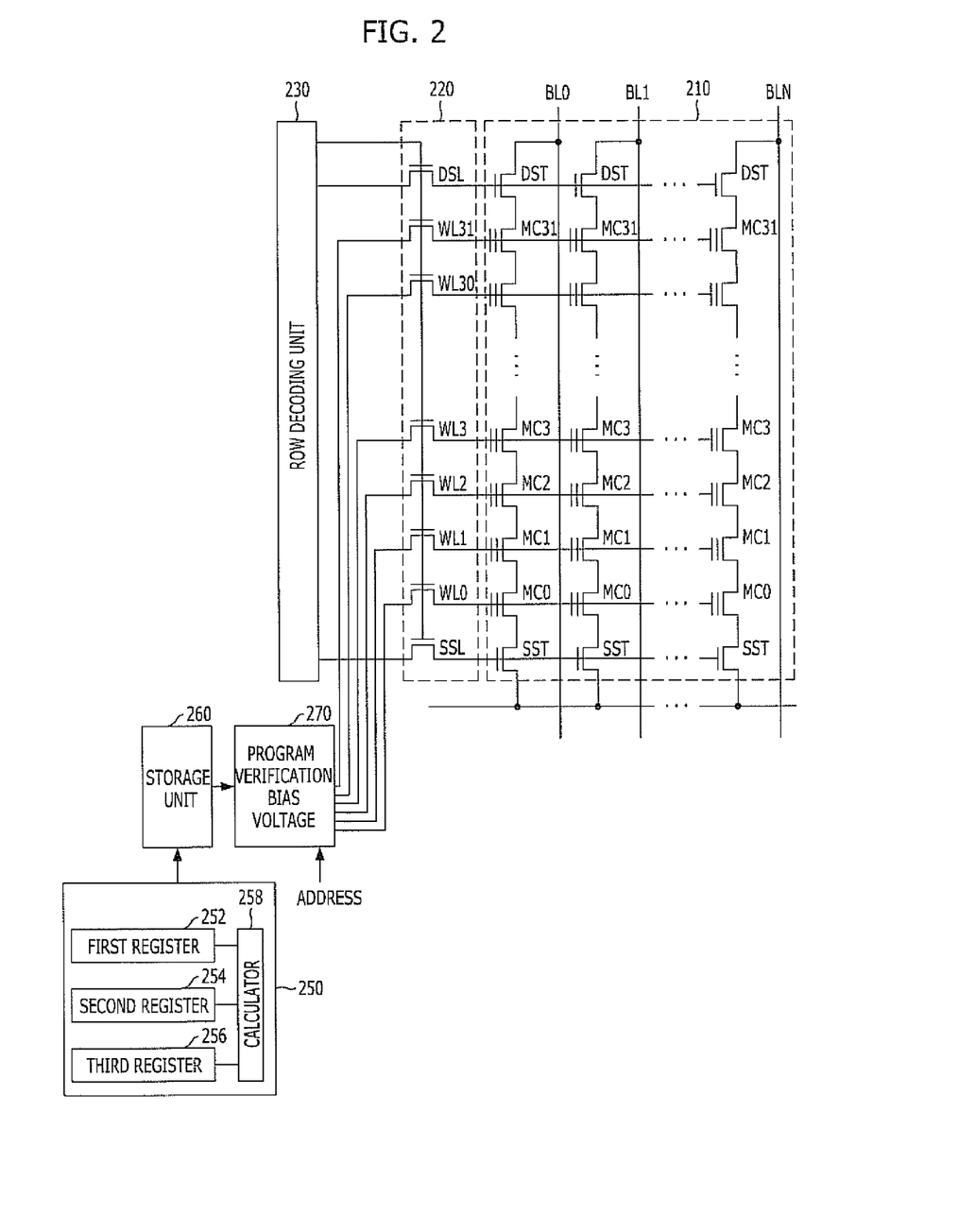
FIG. 2 is a circuit diagram illustrating a structure of a non-volatile memory device in accordance with another embodiment of the present invention.

Hereafter, a structure of a non-volatile memory device in accordance with another embodiment of the present invention is described by referring to FIG. 2. FIG. 2 is a circuit diagram illustrating a structure of a non-volatile memory device in accordance with another embodiment of the present invention.

The non-volatile memory device shown in FIG. 2 includes a memory cell block 210, a computation unit 250, a storage unit 260, and a program verification bias voltage providing unit 270.

The memory cell block 210 is formed of a plurality of cell strings coupled with bit lines BL0 to BLN, and each cell string includes a source selection transistor SST, a plurality of memory cell transistors MC0 to MC31, and a drain selection transistor DST.

A gate of the source selection transistor SST is coupled in common with source selection lines SSL, and a gate of the drain selection transistor DST is coupled with a drain selection line DSL. Control gates of the memory cell transistors MC0 to MC31 are coupled with word lines WL0 to WL31, and the memory cell transistors MC0 to MC31 are coupled in series between the source selection transistor SST and the drain selection transistor DST.

The number of memory cells included in one cell string may be 32, as illustrated in the drawing, but it may be different, e.g., 16 or 64, according to the storage capacity/needs of the memory device. The source selection transistors SST and the drain selection transistors DST are MOS transistors, and the memory cell transistors MC0 to MC31 may be floating gate transistors.

The computation unit 250 sums a characteristic voltage according to characteristics of each memory cell (that is, offset bias voltage for each group and an offset bias voltage for an edge word line) and a default bias voltage and generates a program verification bias voltage corresponding to the memory cell transistors MC0 to MC31 before the program pulse according to a program operation is applied to the memory cell transistors MC0 to MC31. The computation unit 250 includes a first register 252, a second register 254, a third register 256, and a calculator 258.

The characteristic voltage includes an offset bias voltage for each group set up for a group of memory cells having the same characteristics and an offset bias voltage for an edge word line set up in the memory cell transistors disposed on both ends of the cell string.

The first register 252 stores the default bias voltage, and the second register 254 stores the offset bias voltage for each group of the memory cell transistors MC0 to MC31, and the third register 256 stores the offset bias voltage for an edge word line.

The calculator 258 generates a program verification bias voltage corresponding to the memory cell transistors MC0 to MC31 by summing up the default bias voltage stored in the first register 252, the offset bias voltage for each group stored in the second register 254, and the offset bias voltage for an edge word line stored in the third register 256.

The storage unit 260 stores the program verification bias voltage generated in the calculator 258 of the computation unit 250.

The program verification bias voltage providing unit 270 receives addresses corresponding to the word lines of the memory cell transistors MC0 to MC31 and supplies a program verification bias voltage which corresponds to the addresses and stored in the storage unit 260, when the program pulse is applied to the memory cell transistors MC0 to MC31.

Figure 3:
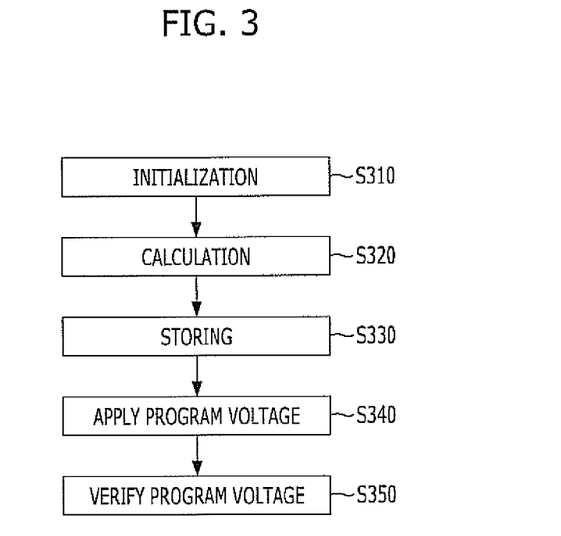
FIG. 3 is a flowchart describing an operation of a non-volatile memory device in accordance with an embodiment of the present invention.

Hereafter, the operation of a non-volatile memory device fabricated in accordance with an embodiment of the present invention is described by referring to FIGS. 3 and 4. FIG. 3 is a flowchart describing an operation of a non-volatile memory device in accordance with an embodiment of the present invention. FIG. 4 is a waveform of an operation of a non-volatile memory device in accordance with an embodiment of the present invention.

As shown in FIGS. 3 and 4, the non-volatile memory device in accordance with the embodiment of the present invention includes: an initialization step S310, a calculation operation step S320, a storing step S330, a program voltage application step S340, and a program voltage verifying step S350.

In the initialization setup step S310, diverse parameters used for a non-volatile memory device are set up before a program pulse according to a program operation is applied, where the set up step is included the initialization operation P0 in FIG. 4. A default bias voltage, an offset bias voltage for each group set for a group of memory cells having the same characteristics, and an offset bias voltage for an edge word line set in the memory cell transistors disposed on both ends of the cell string are set up.

In the calculation operation step S320, a program verification bias voltage verifying a program voltage is generated by summing the default bias voltage, the offset bias voltage for each group, and the offset bias voltage for an edge word line before the program pulse according to the program operation is applied, where the summing step is included in the initialization operation P0 in FIG. 4.

In the storing step S330, the program verification bias voltage generated in the calculation operation step S320 is stored before the program pulse according to the program operation is applied, where the storage step is included in the initialization operation P0 in FIG. 4.

In the program voltage application step S340, a program voltage corresponding to the word lines of the multiple memory cell transistors, which are the memory cell transistors MC0 to MC31 shown in FIGS. 1 and 3, is applied during the program operation.

In the program voltage verifying step S350, whether the multiple memory cell transistors, which are the memory cell transistors MC0 to MC31 shown in FIGS. 1 and 3, are programmed or not is verified by applying the program verification bias voltage stored in the storing step S330 to the word lines of the multiple memory cell transistors, which are the memory cell transistors MC0 to MC31 shown in FIGS. 1 and 3, after the program voltage is applied to the word lines in the program voltage application step S340.

Referring to FIG. 4, after the program pulse is applied, a first program verification bias voltage PV1 stored in the storing step S330 is read during a first setup duration P1. Subsequently, the first program verification bias voltage PV1 is applied to the corresponding word lines of the memory cell transistors, which are the memory cell transistors MC0 to MC31 shown in FIGS. 1 and 2.

Subsequently, a second program verification bias voltage PV2 stored in the storing step S330 is read during a second setup duration P2. The second program verification bias voltage PV2 is applied to the corresponding word lines of the memory cell transistors, which are the memory cell transistors MC0 to MC31 shown in FIGS. 1 and 2.

Subsequently, a third program verification bias voltage PV3 stored in the storing step S330 is read during a third setup duration P3. The third program verification bias voltage PV3 is applied to the corresponding word lines of the memory cell transistors, which are the memory cell transistors MC0 to MC31 shown in FIGS. 1 and 2.

Subsequently, a fourth program verification bias voltage PV4 stored in the storing step S330 is read during a fourth setup duration P4. The fourth program verification bias voltage PV4 is applied to the corresponding word lines of the memory cell transistors, which are the memory cell transistors MC0 to MC31 shown in FIGS. 1 and 2. Here, the word lines of memory cells to which the first to fourth program verification bias voltages are applied may be different for different ones of the first to fourth program verification bias voltages, respectively.

As described above, the program unit time may be decreased by applying the program verification bias voltage that are pre-calculated and stored before the program voltage is applied to the corresponding word lines after the program voltage is applied. This is because the calculation operation for generating the program verification bias voltage after the program operation is unnecessary if the operation is performed in this way.

Figure 5:
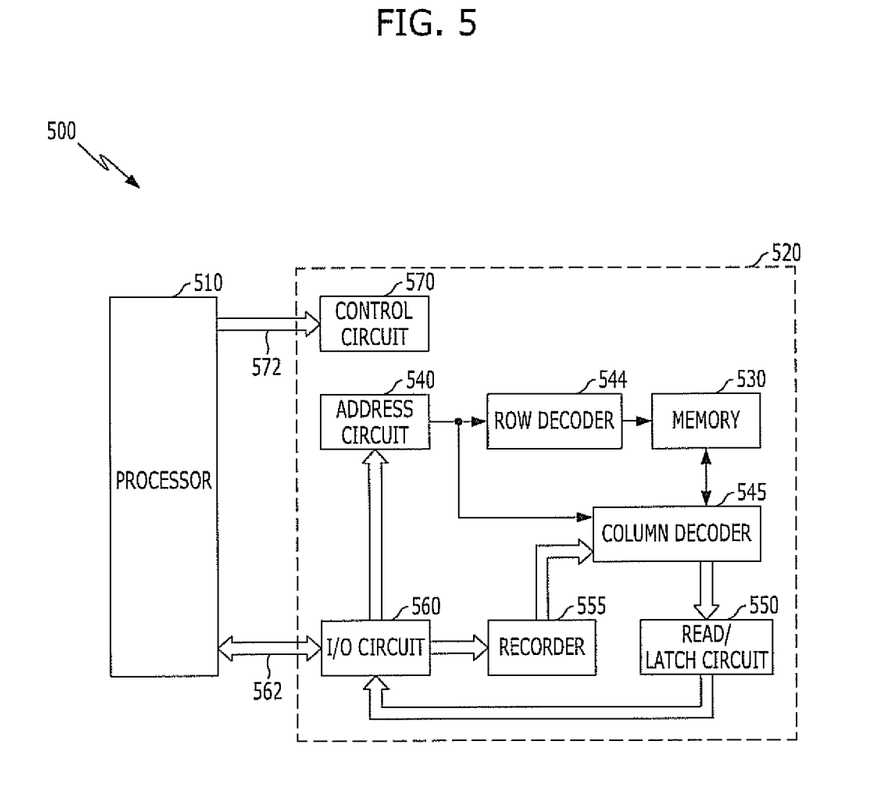
FIG. 5 is a block view illustrating a structure of an electronic memory system having at least one memory device in accordance with yet another embodiment of the present invention.

In other words, the first to fourth setup durations P1 to P4 according to the embodiment of the present invention shown in FIG. 5 are shorter than the first to fourth setup durations P1A to P4D according to the prior art shown in FIG. 7. Thus, the program unit time is reduced.

In the present embodiment, a case in which the first to fourth program verification bias voltages are used during the first to fourth setup durations is taken as an example, but a case where first to $N^{th}$ program verification bias voltages are used during first to $N^{th}$ setup durations may also be implemented according to different design needs.

Hereafter, a structure where an electronic memory system has at least one memory device in accordance with yet another embodiment of the present invention is described with reference to FIG. 5. FIG. 5 is a block view illustrating a structure of an electronic memory system having at least one memory device in accordance with yet another embodiment of the present invention.

The electronic memory system 500 includes a non-volatile memory device 520 including a non-volatile memory according to an embodiment of the present invention and a processor 510 combined with the non-volatile memory device 520.

The electronic memory system 500 may include an additional integrated circuit, where the processor 510 and the non-volatile memory device 520 may be disposed on the same integrated circuit and their illustration in the drawings is limited to characteristics necessary for understanding an exemplary embodiment of the present embodiment.

The processor 510 may be a microprocessor or an application-specific integrated circuit (ASIC).

The non-volatile memory device 520 includes a memory 530, an address circuit 540, a read/latch circuit 550, an input/output (I/O) circuit 560, and a control circuit 570.

Since the memory 530 is described above with reference to FIGS. 1 and 2, a further description thereof is omitted herein.

The address circuit 540 latches an address signal provided through an input/output access interface 562 after the address signal is transferred by the input/output circuit 560. The address signal is received by a row decoder 544 and a column decoder 545 for being decoded and being transferred to the memory 530.

The read/latch circuit 550 may read and latch a page or column of a data received from the memory 530. The input/output circuit 560 has the input/output access 562 to the processor 510 for bi-directional data communication. A recorder 555 coupled with the input/output circuit 560 records a data in the memory 530 through use of column decoder 545.

The control circuit 570 decodes a signal transferred through a control access interface 572 from the processor 510. The signal may include a chip signal, a write enable signal, and an address latch signal used for controlling the operation of the memory 530 which includes a data read operation, a data write operation, and a data erase operation.

The control circuit 570 controls an operation and programming in accordance with an embodiment of the present invention under the control of the processor 510. The control circuit 570 may be a state machine, a sequencer, or a controller.

Figure 6:
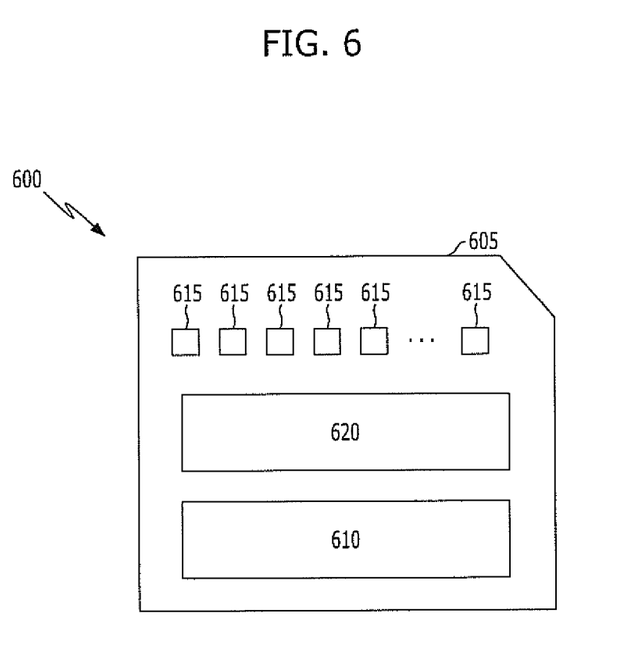
FIG. 6 is a block view illustrating a structure of a memory module having at least one non-volatile memory device in accordance with yet another embodiment of the present invention.

FIG. 6 is a block view illustrating a structure of a memory module having at least one non-volatile memory device in accordance with yet another embodiment of the present invention.

The memory module 600 illustrated in FIG. 6 is presented as a memory card, but the concept of the memory module 600 may be applied to different kinds of erasable or portable memory, for example, USB flash drive.

The memory module 600 includes an optional housing 605 for enclosing at least one memory device 610. At least one memory device includes the non-volatile memory device in accordance with an embodiment of the present invention.

Herein, the housing 605 includes one or more access units 615 for communication with a host device. Examples of the host device include a digital camera, a digital recording and playback device, a Personal Digital Assistant (PDA), a personal computer (PC), a memory card reader, an interface hub and so forth. The access units 615 may each be a standardized interface.

The access units 615 provide an input/output control between the memory module 600 and a host having compatible receptors for the access units 615 and an interface for address and/or data signals.

The memory module 600 may optionally include an additional circuit 620 which may be at least one integrated circuit and/or an additional component.

The additional circuit may include a control circuit, such as a memory control circuit, for controlling an access to the memory device 610 or providing translation between an external host and the memory device 610.

Also, the additional circuit 620 may further include a function unrelated to the control of the memory device 610, such as a logic function that may be performed by an ASIC. Moreover, the additional circuit 620 may include a circuit which restricts a read or write access to the memory module 600, such as password protection and biometrics. In addition, the additional circuit 620 may include a circuit representing the current state or an access state of the memory module 600.

Also, the additional circuit 620 may further include a passive device such as a decoupling capacitor which helps regulate power requirements within the memory module 600.

As described above, a non-volatile memory device in accordance with an embodiment of the present invention and a program method thereof may reduce a program unit time by calculating and storing a program verification bias voltage in advance before a program voltage is applied and then applying the stored program verification bias voltage to a corresponding word line after the program voltage is applied.

According to an exemplary embodiment of the present invention, a non-volatile memory device does not have to perform an operation for generating a different program verification bias voltage every time that the different program verification bias voltage is to be applied due to the different physical characteristics of multiple memory cell transistors MC0 to MC31 from having different positions of the multiple memory cell transistors MC0 to MC31. Such individual program verification bias voltage calculation after each program step may be avoided by applying a pre-calculated and stored program verification bias voltage after a program voltage is applied.

Also, since a program unit time is reduced by applying a pre-calculated and stored program verification bias voltage after a program voltage is applied, the non-volatile memory device in accordance with an embodiment of the present invention may be used for a memory module or system which operates at a high speed.

While the present invention has been described with respect to the specific embodiments, it will be apparent to those skilled in the art that various changes and modifications may be made without departing from the spirit and scope of the invention as defined in the following claims.

What is claimed is:

1. A method for programming a non-volatile memory device including a plurality of memory cells, comprising:
   verifying whether the memory cells are programmed or not by applying a program verification bias voltage, which is calculated and stored during an initialization operation preformed before the programming of the memory cells, after a program voltage is applied to word lines of the memory cells,
   wherein the verifying of whether the memory cells are programmed or not comprises:
      generating the program verification bias voltage by summing a characteristic voltage for a memory cell and a default bias voltage:
      storing the generated program verification bias voltage;
      applying the program voltage to the word lines of the multiple memory cells during the program operation; and
      verifying whether the multiple memory cells are programmed or not by applying the stored program verification bias voltage to a word line for the memory cells after the program voltage is applied.

2. The method of claim 1, wherein the characteristic voltage is a sum of an offset bias voltage for a group of memory cells and an offset bias voltage for an edge word line and the edge word line is a word line coupled to memory cells disposed at opposite ends of a string of memory cells.

3. A method for programming a non-volatile memory device including a plurality of memory cells, comprising:
   generating and storing a program verification bias voltage corresponding to the memory cells by summing a characteristic voltage of a group of memory cells and a default bias voltage before a program pulse is applied to the memory cells; and
   verifying whether the memory cells are programmed or not by applying the stored program verification bias voltage to a word line of the memory cells when the program voltage is applied to the memory cells.

4. The method of claim 3, wherein the characteristic voltage is a sum of an offset bias voltage for the group of memory cells and an offset bias voltage of an edge word line and the edge word line is a word line coupled to memory cells disposed at opposite ends of a string of memory cells.

5. A non-volatile memory device, comprising:
   a plurality of memory cells; and
   a program verification bias voltage providing unit configured to calculate and store a program verification bias voltage corresponding to the memory cells during an initialization operation and provide the stored program verification bias voltage after a program voltage is applied to a word line of the memory cells during a program operation,
   wherein the program verification bias voltage providing unit comprises:
      a first storage for storing a characteristic voltage for a memory cell and a default bias voltage;
      a calculator for generating a program verification bias voltage by summing the default bias voltage and the characteristic voltage that are stored in the first storage; and
      a second storage for storing the generated program verification bias voltage.

6. The non-volatile memory device of claim 5, wherein the characteristic voltage is a sum of an offset bias voltage for a group of memory cells and an offset bias voltage of an edge word line and the edge word line is a word line coupled to memory cells disposed at opposite ends of a string of memory cells.

7. The non-volatile memory device of claim 5, wherein the program verification bias voltage providing unit is configured to receive an address and supply the program verification bias voltage to a word line corresponding to the address.

8. A non-volatile memory device, comprising:
- a memory cell block comprising a plurality of memory cells;
- a computation unit configured to generate a program verification bias voltage corresponding to the memory cells by summing a default bias voltage and a characteristic voltage of a memory cell before a program pulse is applied to the memory cells;
- a storage unit configured to store the generated program verification bias voltage; and
- a program verification bias voltage providing unit configured to provide the program verification bias voltage stored in the storage unit to a word line of the memory cells when a program pulse is applied to the memory cells.

9. The non-volatile memory device of claim 8, wherein the characteristic voltage is a sum of an offset bias voltage for a group of memory cells and an offset bias voltage of an edge word line and the edge word line is a word line coupled to memory cells disposed at opposite ends of a string of memory cells.

10. The non-volatile memory device of claim 9, wherein the computation unit comprises:
- a first register for storing the default bias voltage;
- a second register for storing the offset bias voltage for the group of memory cells;
- a third register for storing the offset bias voltage of an edge word line; and
- a calculator for generating the program verification bias voltage by summing the default bias voltage, the offset bias voltage for the group of memory cells, and the offset bias voltage of an edge word line.

11. The non-volatile memory device of claim 8, wherein the program verification bias voltage providing unit is configured to receive an address and supply a program verification bias voltage to a word line corresponding to the address.

12. The non-volatile memory device of claim 8, wherein the storage unit is configured to store a plurality of program verification bias voltages before the application of the program pulse and the program verification bias voltage providing unit is configured to provide the plurality of program verification bias voltages to word lines of memory cells after the application of the program pulse.

13. The non-volatile memory device of claim 12, wherein the program verification bias voltage providing unit is configured to provide different ones of the plurality of program verification bias voltages to word lines of memory cells at different times, respectively.

* * * * *